US007082386B2

(12) United States Patent
Srinivasa

(10) Patent No.: US 7,082,386 B2
(45) Date of Patent: Jul. 25, 2006

(54) GENERALIZED SOFTWARE MODELING TOOL

(75) Inventor: Deepak M Srinivasa, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 845 days.

(21) Appl. No.: 09/790,247

(22) Filed: Feb. 21, 2001

(65) Prior Publication Data

US 2003/0023413 A1    Jan. 30, 2003

(51) Int. Cl.
*G06F 17/50* (2006.01)
*G06F 9/45* (2006.01)
*G06F 9/44* (2006.01)
*G06F 7/00* (2006.01)

(52) U.S. Cl. .............................. 703/2; 703/22; 717/114; 717/124

(58) Field of Classification Search ................. 703/2, 703/22; 717/104, 132, 133, 124, 114; 707/3
See application file for complete search history.

(56) References Cited

U.S. PATENT DOCUMENTS

| 5,732,192 | A  | * | 3/1998 | Malin et al. ................... 703/2 |
| 6,185,516 | B1 | * | 2/2001 | Hardin et al. .................. 703/2 |
| 6,516,306 | B1 | * | 2/2003 | Alur et al. ..................... 706/10 |
| 6,536,027 | B1 | * | 3/2003 | Grinchuk et al. ............. 716/12 |
| 6,714,936 | B1 | * | 3/2004 | Nevin, III ..................... 707/102 |
| 2003/0131338 | A1 | * | 7/2003 | Georgalas .................. 717/104 |

OTHER PUBLICATIONS

Caughlin, Don "Automating the Metamodeling Process", Proceedings of the 1997 Winter Simulation Conference, pp. 978-985.*
Lee et al, "OOPM/RT: A Multimodeling Methodology for Real-Time Simulation", ACM Transactions on Modeling and Computer Simulation, vol. 9, No. 2, Apr. 1999, pp. 141-170.*
Hill, David "Object-Oriented Analysis and Simulation", Addison-Wesley Publishing Company, 1996, pp. 9-14,28-29,41-44,54-55;95-96, 107-110.*
Hajjar et al, "Building a Special Purposes Simulation Tool for Earth Moving Operations", Proceedings of the 28th conference on Winter simulation, Nov. 1996, pp. 1313-1320).*
Devanbu et al, "Extracting formal domain models from exsisting code for generative reuse", ACM SIGAPP Applied Computing Review, vol. 5 Issue 1, Jun. 1997.*
Hamilton, et al, "A survey of object-oriented methodologies", Proceedings of the conference on TRI-Ada '95: Ada's role in global markets: solutions for a changing complex world, Nov. 1995.*

(Continued)

*Primary Examiner*—Paul Rodriguez
*Assistant Examiner*—Thomas Stevens
(74) *Attorney, Agent, or Firm*—Schmeiser, Olsen & Watts; William H. Steinberg

(57) ABSTRACT

A method, system, software tool and computer program product for different modeling environments is described. A metamodel representation, termed a "definition graph" is configured as a directed weighted multi-graph representation of ordered pairs, being node and edge pairs. Each node and edge has an associated weight and attributes. The definition graph is validated. A user-generated model is then defined, and checked for compatibility with a validated metamodel. This is achieved by extracting a template graph from the instance graph of the user model as the basis for the comparison.

21 Claims, 7 Drawing Sheets

OTHER PUBLICATIONS

Caughlin, Don, "Verification, validation, and accreditation (VV&A) of models and simulations through reduced order metamodels", Proceedings of the 27th conference on Winter simulation, Dec. 1995.*

Nordstrom-G.G., "Metamodeling—Rapid Design and Evolution of Domain-Specific Modeling Environments", Dissertation, Vanderbilt University May 1999. p. 1-155.*

Tolujev et al., "Assessment of Simulation Models Based on Trace-file Analysis: A Metamodeling Approach". ACM. pp. 443-450, 1998.*

Hulbut-R.R., "Managing Business Domain Architectures through Use Case Formalisms" IITRI 1997 Revision 2.02 Ph.D. Thesis Proposal. p. 1-95.*

Kaindl-H., "A Design Process Based on a Model Combining Scenarios with Goals and Functions" IEEE 2000. pp. 537-551.*

Jansesen et al., "Making Graphs Reducible with Controlled Node Splitting" Delft Unvi. of Tech. ACM 1997. p. 1031-1052.*

Lam et al., "Optimal Edge Ranking of Trees in Linear Time" 1989 Univ of Hong Kong p. 436-445.*

Minato et al. "Shared Binary Decision Diagram with Attibuted Edges for Efficient Boolean Function Manipulation" IEEE 1990. p. 52-57.*

Kleijnen et al., "Bootstrapping and Validation of MetaModels in Simulation" 1998, p. 701-706.*

Barton-R.R., "Simulation Models" 1998 Winter Simulation Conference 1998, p. 167-174.*

* cited by examiner

GENERALIZED SOFTWARE MODELING TOOL

FIELD OF THE INVENTION

This invention relates to the field of software modeling, and particularly to a software tool that can be configured with different modeling environments allowing the creation of a large class of models.

BACKGROUND OF THE INVENTION

Software modeling systems usually presents the user with a graphical user interface, and allows specific models that the software is designed for to be developed. Some examples are:

(a) A database modeling tool, which allows the database designers to model entities, relationships between these entities, constraints like participation constraints, cardinality of relationships and such other aspects as weak entities, key attributes, composite attributes, identifying relationships, etc. See, for example, "Visual DBM" from YR Soft, Inc. described at its website See also, "ERwin" for database modeling and design from Blue Ice, Inc. at www.blueice.com/erwin.htm.

(b) An object-oriented CASE tool, which allows the user to create classes and relationships between them, and capture them as class diagrams. It also facilitates the modeling of objects at run-time in the system, allows modeling of dynamic behavior like state transition diagrams and architecting the software by means of component diagrams and deployment diagrams. An example of this is "Rational Rose 98", from Rational Software Corporation, described at its website.

(c) A procedural CASE tool, which allows the user to develop data flow diagrams and structure charts. An example of this is "FlowCharting PDQ", from Hallogram, Inc, described at its website.

(d) A business Process Re-engineering tool, which allows the user to create process definitions and specify workflows for the business processes. There are two convenient examples of this modeling tool. The first is "BPwin" from Blue Ice, Inc., described at its website. The second is "ProVision WorkBench" from Proforma Corporation, described at its website.

The systems mentioned above are built with the knowledge of the types of models that they will allow the user to develop. Thus, each tool can support a known, limited set of models to be developed. This is shown in FIG. 1, which is an illustration of the general strategy employed by the modeling tools, where the "knowledge" about the models that the user is allowed to create is embedded into the software of the modeling system.

In other words, a user 10 interacts with the modeling system 12 via a Graphical User Interface 14, which presents the user with interfaces for creating specific models. The GUI14 interacts with Knowledge 16 which is a knowledge base that has knowledge about the type of system models that this system allows the user to create. Models thus developed become outputs 18 from the system 12.

Limitations of such systems include:

(a) If there are changes in the way the models are created, the knowledge embedded in the software has to be updated. Since this knowledge is an inherent part of the software, this needs modification of the code, recompilation and possibly re-linking, before the software is rendered for use with the required modifications.

(b) There could be a need to support variations in the way in which the models are created. For example, the workflow modeling done by company A could be different from the way company B does it. It depends on the particular company and their specific needs, although both of them are basically doing the same activity, namely, defining workflows for business processes.

In these modeling systems, the focus is not on providing a modeling system, which allows the user to create different types of models. The user has no means of controlling the behavior of the system. There also is no consideration of building a system, which is adaptable to changes and has high reusability value.

Meta modeling and method engineering has been the focus of only few research projects. One such project is known as MetaPHOR. The acronym MetaPHOR stands for: Metamodeling, Principles, Hypertext, Objects, and Repositories. The main goal of this research project is to develop architectures, models and technical solutions for the next generation of configurable CASE environments and principles for their effective use through method engineering. This project has yielded tools like MetaEdit and MetaEdit+, which have been commercialized. This research project has also developed a meta modeling language called GOPRR (Graph Object Property Role Relation).

MetaView is a textual metamodeling language also known in the prior art. The aim of this project is to develop CASE-shells, for engineering of SDM (Software Development Methods), support graphical extensions and automatic transformations. As part of the MetaView project, a modeling system called EARA/GE (Entity Aggregation Relation Attribute/Graphical Extension) has been developed.

Known prior art modeling arrangements such as MetaPHOR, MetaView, GOPHR and EARA/GE attempt, with various degrees of success, to overcome the limitations originally discussed. It is an object of the present invention, however, to provide a generalized modeling tool that utilizes a novel and inventive specific implementation that also addresses the limitations originally discussed.

SUMMARY OF THE INVENTION

Therefore, the invention discloses a method for modeling a system, comprising the steps of:

configuring a metamodel with a specified environment in a directed weighted multi-graph representation;

validating said metamodel;

representing a user-generated model; and checking compatibility of the user model with the validated metamodel.

The invention further discloses a computer-aided modeling system comprising:

input means by which a metamodel having a specified environment in a directed weighted multi-graph representation can be input, and by which a user-generated model also can be input;

displaying means for displaying the metamodel and by which the user model can be displayed; and processor means, coupled to the input means and the display means, for validating the input metamodel and for checking compatibility of the user model with the validated model.

The invention further discloses a software tool for modeling a system that is useable to configure a metamodel with a specified environment in a directed weighted multi-graph representation, validate the metamodel, represent a user-generated model, and check the compatibility of a user model with a validated metamodel.

The invention yet further discloses a computer program product comprising computer program code means carried on a storage medium, the program code means including:

a first program code element for configuring a metamodel with a specified environment in a weighted multi-graph representation;

a second program code element for validating the metamodel;

a third program code element for representing a user-generated model; and a fourth program code element for checking compatibility of the user model with the validated model.

The metamodel representation may be a definition graph formed by an ordered pair, where the first element of the pair is a set of nodes and the second element of the pair is a set of edges. Each node and each edge may have associated with it a weight, a node weight indicating a multiplicity value, and an edge weight indicating directionality and the multiplicity values of each node associated with that edge. Each node and each edge may also have associated with it one or more attributes.

Further, in the metamodel validation step, the definition graph may be validated by determining whether the multiplicity value of a node and the multiplicity value of the other node in the edge correctly determine the multiplicity value of the second node. In the representing step, the model representation may be an instance graph formed by an ordered pair, where the first element of the pair is a set of nodes and the second element of the pair is a set of edges. The model compatibility checking step preferably includes extracting a template graph from the instance graph and verifying the template graph for compatibility with the definition graph. The extracting step is preferably performed by creating a skeletal definition graph template from the definition graph, parsing the instance graph and for every node and edge in the instance graph, updating the template graph. The model compatibility checking step may persist a user model if determined to be compatible with the metamodel.

Contrary to the prior art, which compiles instances to check for validity of user models, the present invention extracts the definition from the instance for comparison with a validated metamodel.

BRIEF DESCRIPTION OF THE DRAWINGS

Embodiments of the invention will now be described with reference to the accompanying drawings, in which.

DETAILED DESCRIPTION INCLUDING BEST MODE

A. Overview

The invention has the capability to allow the user to create models, which have one basic similarity. That is, they can, at some level of abstraction, be represented as directed weighted multi-graphs. Directed weighted multi-graph is a strong data structure, which includes directed multi-graph with no weights, directed linear graph with/without weights, undirected multi-graph with/without weights, and undirected linear graph with/without weights. All kinds of tree structures are also essentially graphs. Thus, a large class of models is covered.

Weighted multi-graphs facilitate the implementation of a generalized modeling system, which has the following behavior:

(a) Allows the user to configure the modeling system with a modeling environment, which constitutes a metamodel (or definitions), describing the kinds of models that can be created by the tool.

(b) Once the modeling system is configured for a particular modeling environment, it allows the user to create models that are instances of the metamodel (i.e., the models that are created by the user should conform to the definitions provided).

(c) Once the user creates the models, they can be validated to check the integrity of the models and can be persisted if the validation succeeds.

(d) The system is reusable at different levels and highly extensible.

The strategy employed is to take the "knowledge" of the types of models out of the system, and let the system only have "meta-knowledge" (i.e., knowledge about the knowledge of the types of models), which will be used by the system to dynamically acquire the knowledge about a particular class of models (i.e., when the user configures the system), and then let the user create models conforming to the definitions provided by the acquired knowledge. Thus, the system behaves according to the configured modeling environment, which not only includes the semantic information about the types of models that can be created, but also the visual aspects of the models.

Figure 1:
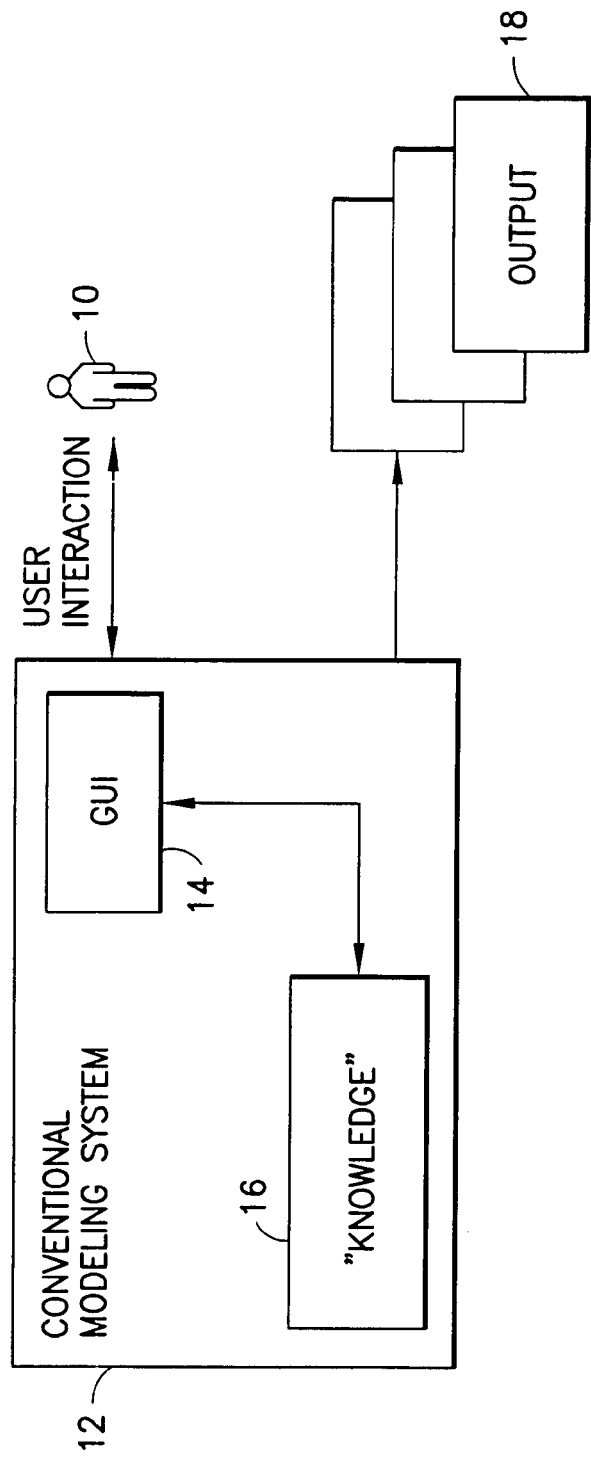
FIG. 1 is a block diagram illustrating the general strategy employed by known modeling tools, where the "knowledge" about the models that the user is allowed to create is embedded into the software.
Figure 2:
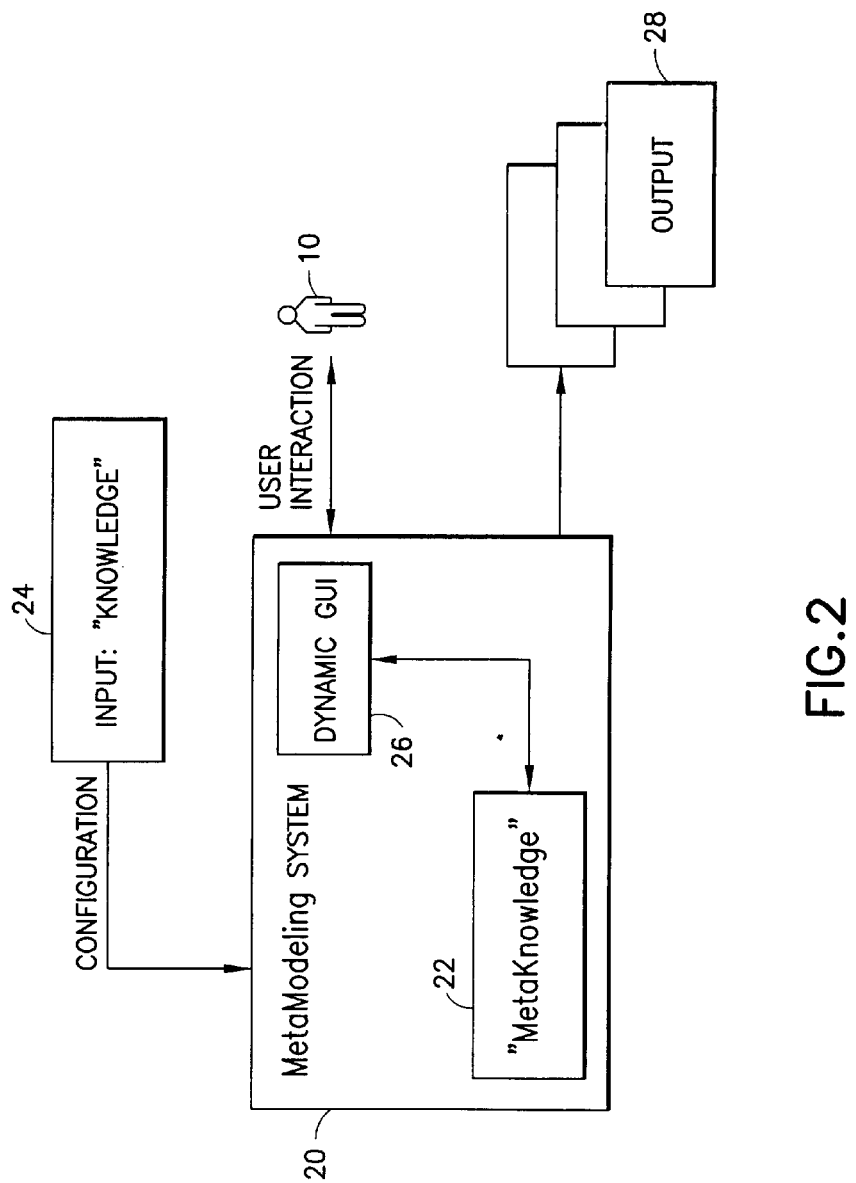
FIG. 2 is a block diagram illustrating the strategy employed by the present invention, where the system has only meta-knowledge and the knowledge about the types of models is acquired dynamically during the configuration phase.

FIG. 2 shows a user 10 interacting with a metamodeling system 20. The system 20 includes a Metaknowledge Base 22, which has the capability to learn the knowledge of the types of models that the system will allow the user to create. This is the only information that is hard-coded into the system 20. Information about the various modeling environments is given to the system in a phase called the configuration phase, represented as the true, INPUT: "KNOWLEDGE" 24 to be used by the system for modeling. The system 20 further includes a Dynamic GUI 26, which presents the user with interfaces for creating models, corresponding to the configured modeling environment. In other words, the GUI 26 renders models of different modeling environments in different ways based on the information it gets during the configuration phase. Output models 28 arise from the system 20 when configured.

Figure 3:
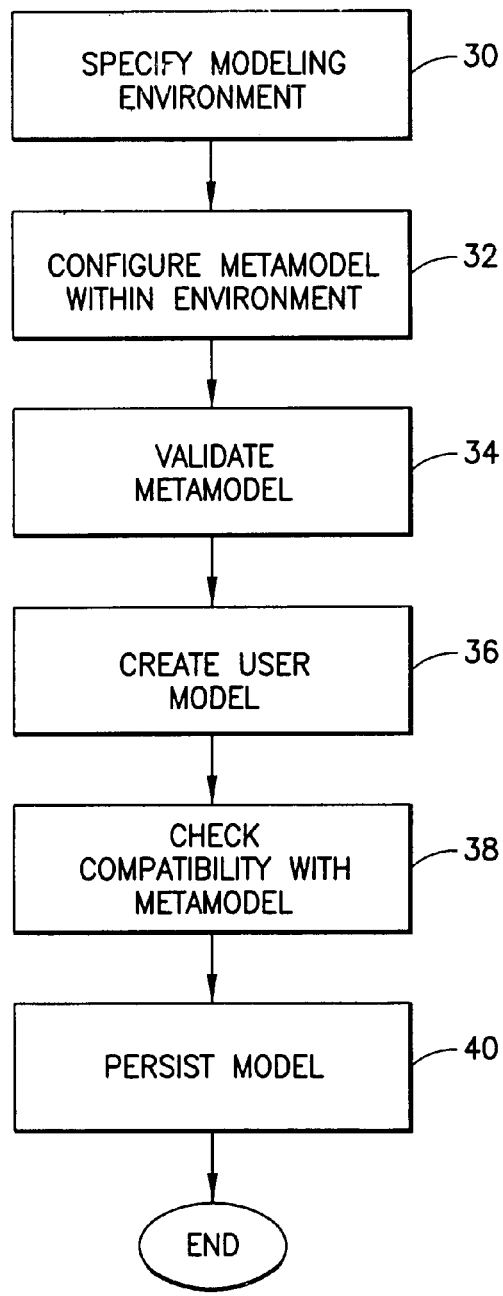
FIG. 3 is a block flow diagram showing the broad steps in a modeling system according to the invention.

FIG. 3 is a block flow diagram showing the broad steps of the invention in modeling a user-specified system. Each step will be subsequently described in greater detail.

In step 30, a modeling environment is specified, typically by a user. As an example, the environment can include one or more of processes, activities, and input and output data, if the modeling environment is for workflow modeling. In step 32, a metamodel is configured within the modeling environment as a directed weighted multi-graph. In step 34 the metamodel is validated. There can be many such metamodels available to a user.

In step 36, a user creates a model, being an instance of a metamodel. In step 38, compatibility of the validated model is checked with the relevant metamodel. If compatible, the model can be persisted, in step 40.

What follows describes an architecture, which realizes the above strategy and a method.

B. System Architecture

Figure 4:
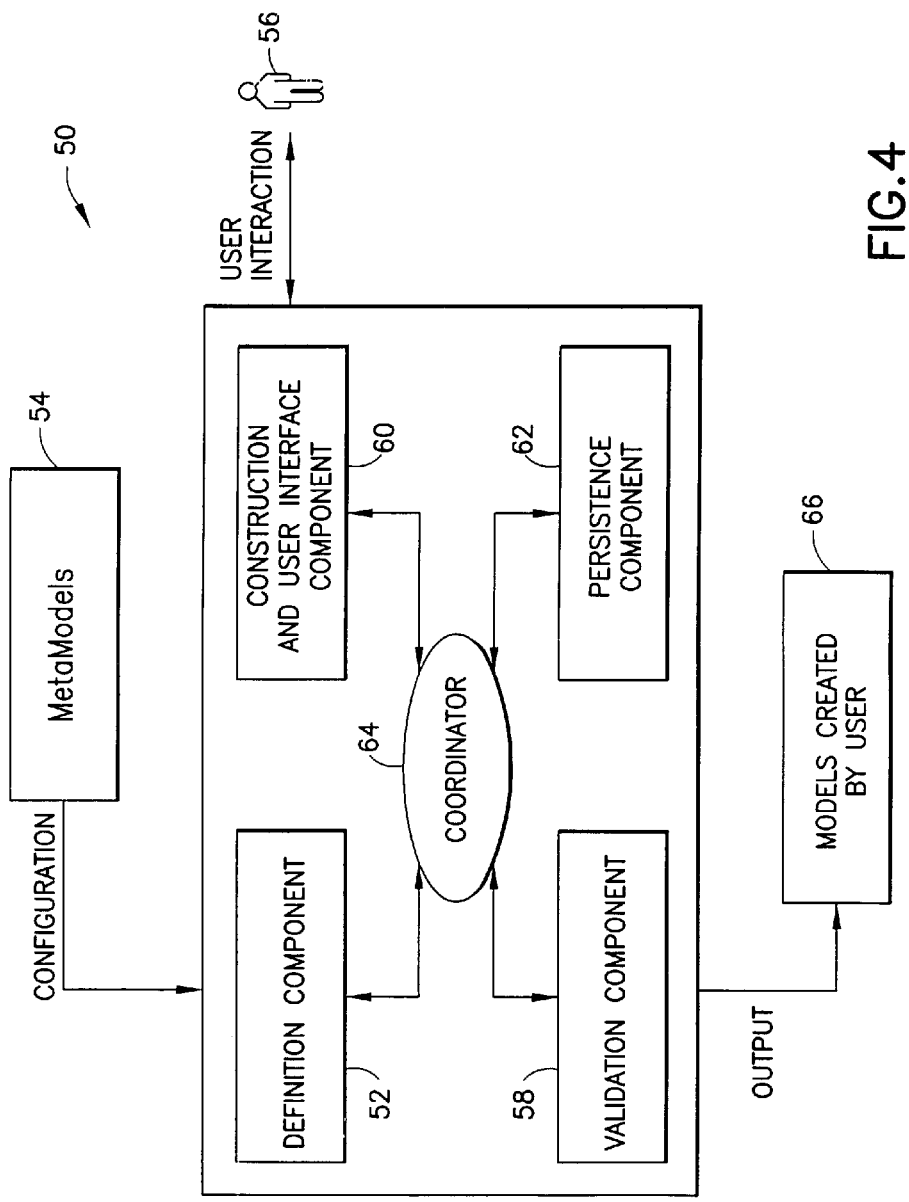
FIG. 4 shows one possible architecture of a generalized modeling system according to the invention.

The responsibilities and collaborations of each of the components of the architecture 50 are depicted in FIG. 4.

The definition component 52 is responsible for reading-in the metamodels 54 supplied by the user 56 during the configuration phase, using its meta-knowledge to build the knowledge required for the current configuration, and validating that the metamodels 54 supplied by the user 56 are good and conform to the meta-knowledge that the system possesses. The metamodels, thus validated and transformed into a usable form by the definition component 52, are available for use by other components.

The validation component 58 is responsible for validating the models created by the user. It takes the currently configured metamodel (from the definition component 52), and the model created by the user 56 (from the construction and user interface component 60) as inputs. It then checks whether the user created model conforms to the metamodel that the system is currently configured for resulting in validated models 66.

The construction and user interface component 60 is responsible for obtaining the currently configured metamodel from the definition component 52, and allows the user 52 to create models. It makes as many checks as possible in allowing the user to create models conforming to the metamodel. However, it cannot completely validate the conformance of the models created (thus, there is a separate validation component 58). The other important responsibility of this component 60 is to provide a user interface that is configured for the current metamodel. It is noted here that the modeling environment consists of the metamodel, which gives the knowledge about the type of models that can be created and also the user interface components associated with that metamodel.

The responsibility of the persistence component 62 is to persist the models given in a suitable form. This may be as XML files, or in a database, or in any other proprietary format.

The coordinator component 64 is introduced as a mediator between the other components 52,58,60,62 in order to reduce the dependency of the components on one another. Each component exposes an interface, which the coordinator 64 knows. The logic about the sequence of activities to be performed in configuring the system, creating a model, validating it and persisting it is present inside the coordinator component 64. This provides for maximum reusability and de-coupling of the other components.

In order to realise such an architecture, it is necessary to consider the following issues:

1. How to represent the metamodels, supplied by the user, in the system so that it is convenient for other components to use it.
2. How to validate whether the metamodel given by the user is correct.
3. How to represent the models created by the user in the system, so that it is easy and efficient to validate the model for conformance to the metamodel.
4. What steps are to be taken by the Construction sub-component 60, while permitting the user to create models. How does the User Interface sub-component 60 change depending on the metamodel configuration.
5. How to validate whether the models created by the user are conforming to the metamodel configured.

1. Metamodel Representation

The metamodel is represented as a directed weighted multi-graph. This metamodel representation is called a "definition graph". The model that the user creates using this tool will also be represented as a graph, which shall be called an "instance graph".

A definition graph $G_d$ is defined as an ordered pair $(N_d, E_d)$ where:

1. $N_d = \{N_{d1}, N_{d2}, \ldots, N_{dl}\}$ is the set of nodes in the definition graph, such that:

Each node $N_{dj}$ is associated with a unique identifier $n_j$

Given two nodes $N_{dx}$ and $N_{dy}$, in the definition graph, their identifiers have the following properties $n_{dx} \neq n_{dy}$ either $n_{dx} > n_{dy}$ or $n_{dy} > n_{dx}$ (this ordering constraint will be useful later)

Each node is associated with a name. This name of a node in the definition graph will become a "type" in the instance graphs.

Each node is associated with a Node-Renderer Component, which will be used by the UI component 60 (to be discussed later) to render nodes of this type in the models created by the user.

Each node is associated with a vector of attributes. Each attribute will be associated with an Attribute Editor and Attribute Validator, which will be used by the UI component. These attributes represent the attributes that the nodes of this type in the instance graphs can have when the user creates the models.

Each node has a weight, which has the multiplicity information encoded. The multiplicity values that are supported by this system are ? (0 or 1), 1 (exactly 1), * (any number), +(1 or more). This multiplicity value indicates the number of nodes of this type that can be present in the instance graphs. Three bits will be used to encode the multiplicity information. Thus, the weight associated with each node will be one byte. A byte is assumed to be the smallest unit of information that can be stored in a computer's memory.

The encoding is done two times in different manners to facilitate the validation of the metamodel and then the validation of the instance models. Initially, before metamodel validation (i.e., when the metamodel is first taken as input from the user during configuration), the encoding is done as follows.

| Multiplicity | Bit Pattern |
| --- | --- |
| ? | 001 |
| 1 | 010 |
| + | 100 |
| * | 111 |

The logic behind this kind of encoding will become apparent when the validation of metamodels is discussed. But, after the metamodel is validated, the weight encoding is changed to suit the method for the model validation. The encoding will then be done as follows:

| Multiplicity | Bit Pattern |
| --- | --- |
| ? | 011 |
| 1 | 010 |
| + | 110 |
| * | 111 |

As can be observed, ORing (logical OR operation) 010 to the weights of the first table, obtains the weights in the second table. The reason as to why this is done is explained later.

1. $E_d = \{E_{d1}, E_{d2}, \ldots, E_{dl}\}$ is the set of edges in the definition graph, such that:

Each edge $E_{dj}$ in the graph is associated with a unique edge identifier $e_{dj}$ Each edge is associated with an ordered pair of nodes. But, unlike normal directed graph representation, where an edge (a,b) means the edge is directed from a to b and that (b,a) is different from (a,b), a different representation is given to the ordered pair and the directionality of the edge is captured in a different manner. So, if an edge is associated with two nodes $N_{dx}$ and $N_{dy}$, then an ordered pair $(N_{dx}, N_{dy})$ is associated with that edge if $n_{dx} < n_{dy}$, otherwise, the ordered pair associated with the edge would be $(N_{dy}, N_{dx})$. Thus, ordering is necessary, but does not reflect the directionality of the edge, as in other directed graph representation. The reason as to why this is done will be explained later.

Each edge in the definition graph is associated with a name, which will be the type of the edge in the instance graphs created by the user.

Each edge will be associated with an Edge-Renderer, which will be used by the UI component 60 to render the edge.

Each edge has a vector of attributes. Each attribute is associated with an Attribute Editor and Attribute Validator, which will be used by the UI component 60 during the construction of the models by the user 56.

Each edge is associated with a weight, which has encoded information about the directionality of the edge, and the multiplicity values for each node associated with this edge.

The directionality value of an edge in the definition graph indicates the directions that the edges of this type can have in the instance graphs. Similarly, the multiplicity values of each associated node for this edge in the definition graph represents the number of nodes that can be associated with edges of this type in the instance graphs. The encoding of the multiplicity values is similar to the encoding done for node multiplicity above. Here, two such 3-bit patterns are needed to store the multiplicity values of each node associated with the edge. Also, note that the encoding of the multiplicity values changes after the metamodel validation as indicated previously when the weights for the nodes were discussed. The encoding scheme is repeated again for completeness.

Encoding before the metamodel validation

| Multiplicity | Bit Pattern |
| --- | --- |
| ? | 001 |
| 1 | 010 |
| + | 100 |
| * | 111 |

Encoding after the metamodel validation, when the metamodel is ready for model validation.

| Multiplicity | Bit Pattern |
| --- | --- |
| ? | 011 |
| 1 | 010 |
| + | 110 |
| * | 111 |

In addition to encoding the multiplicity values, it is necessary to encode the directionality information also for an edge. For an edge associated with two nodes $N_{dx}$ and $N_{dy}$, represented by the ordered pair $(N_{dx}, N_{dy})$ such that $n_{dx} < n_{dy}$, the directionality can be from $N_{dx}$ to $N_{dy}$, or from $N_{dy}$ to $N_{dx}$ or in both directions. Thus there are three combinations, which can be encoded by 2 bits, as shown in the following table. Also, the encoding of the directionality values will remain same before and after the metamodel validation.

| Directionality | Bit Pattern |
| --- | --- |
| $N_{dx} \rightarrow N_{dy}$ | 01 |
| $N_{dx} \leftarrow N_{dy}$ | 10 |
| $N_{dx} \leftrightarrow N_{dy}$ | 11 |

Thus 3+3+2 bits are needed for encoding the multiplicity values of both the associated nodes and the directionality value. So, one byte will be needed to encode this information. Thus, the weight of an edge in the definition graph is one byte encoded as follows:

| Multiplicity of node 1 3 bits | Multiplicity of node 2 3 bits | Directionality 2 bits |
| --- | --- | --- |

The reason for encoding the weights in these manners will be evident once the validation algorithm is discussed.

2. Metamodel Validation

The metamodel supplied to the system during configuration phase can be in any suitable format. One format would be an XML file having information about the nodes, edges and their properties described above. This information will be read in by the definition component and a definition graph would be constructed as per the above specifications. It is not enough to simply create a definition graph from the given information. Not all metamodels make sense. The metamodel given by the user must be determined to be a good one.

Figure 5:
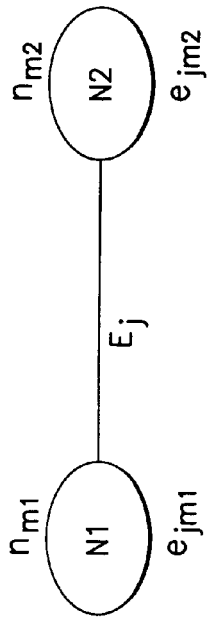
FIG. 5 shows a simple metamodel.

Consider the situation shown in FIG. 5. Here the two nodes N1 and N2 are connected by an edge Ej. The multiplicity of N1 and N2 are $n_{m1}$ and $n_{m2}$ respectively. The multiplicity of node N1 in the edge Ej is $e_{jm1}$ and the multiplicity of the node N2 in edge is $e_{jm2}$. Although the user is free to give any value to these multiplicity items in the metamodel that he uses to configure the system, not all combinations make sense. For example, consider the following values, $n_{m1}=1$, $e_{jm1}=1$, $e_{jm2}=1$, $n_{m2}=*$. This means that there should be exactly on node of type N1 in the instance graphs. That node of type N1 has an association with nodes of type N2. The multiplicity values indicate that this is a one-to-one relation. With this being the case, the user cannot be permitted to provide a multiplicity value of * for node N2, because * means that no node of type N2 could be present in the instance graphs. This is an inconsistent definition. Hence, metamodel supplied by the user has to be validated before proceeding. The following algorithm does the same. The logic used in this algorithm is that the multiplicity value of a node and the multiplicity value of the other node in the edge determine the multiplicity value of the other node.

Algorithm for Metamodel Validation:

```
For all edges in the definition graph (index j=1 to number of
edges)
    Check if the nodes that this edge Ej refers are present
    in the NodeTable of the definition graph. If one or both
    of them are not present, report error and quit.
    Initialize the variables nm1, nm2, ejm1, ejm2 with the
    multiplicity values of Nodes 1 and 2 associated with
    this edge, the multiplicity value of the Node1 in the
    edge Ej, and the multiplicity value if the Node 2 in the
    edge Ej.
    If (!match (nm2, estimate (nm1, ejm2))) report error and
quit.
    If (!match (nm1, estimate (nm2, ejm1))) report error and
quit.
End loop
```

There are two functions used in the above algorithm, namely, match( ) and estimate( ). The behavior of these functions can be understood by the following pseudocode.

```
Function estimate (multiplicity1, multiplicity2) returns
multiplicity value
    If (multiplicity1 == 001 || multiplicity2 == 001) return
    (111)
        Else return (multiplicity1 | multiplicity2).
End function
```

Note here that the operation performed above is bitwise OR operation and all numbers are in binary. Thus, the estimate function gives an encoded most liberal multiplicity value of the two multiplicity values that it receives.

```
Function match (secondNodeMultiplicity, estimate) returns
Boolean
If (secondNodeMultiplicity == 111)
    If (estimate == 111) return true;
    Else return false;
```

```
Else if ((secondNodeMultiplicity & estimate) !=0) return true;
    Else return false;
End function
```

The operation performed above is the bitwise AND operation. The match function finds out if the already existing multiplicity of the node matches with the estimated multiplicity based on the multiplicity of the other node and the multiplicity value of this node participating in the edge.

The system proceeds further only if it finds that the metamodel supplied by the user is correct by using the above algorithm. The above algorithm is very simple and the time complexity is $O(n_e)$, where $n_e$ is the number if edges in the definition graph. This simplicity has been achieved only by the intelligent encoding of information containing the multiplicity values into the weights of the nodes and the edges in the definition graph. After validation, the weights of the nodes and the edges of the definition graph will be updated to change the encoding of the multiplicity value as shown in the second table above. The following algorithm easily does this.

```
Function changeEncoding
    For all nodes in the definition graph
        Weight |= 64; //bit pattern for 01000000
    End for loop
    For all edges in the definition graph
        Weight |=72; //bit pattern for 01001000
    End for loop
End function
```

NodeTable and EdgeTable, which are both hash tables keyed by node identifier and edge identifier respectively, are available for use by other components as shown below.

| Node Table for Definition Graph | | | | |
|---|---|---|---|---|
| Node_id | Name | Weight | Node Renderer | Attribute Vector |

| EdgeTable for Definition Graph | | | | | | |
|---|---|---|---|---|---|---|
| Edge_id | Name | Node1 | Node2 | Weight | Edge Renderer | Attribute Vector |

3. Model Representation

The models created by the user are also represented as directed graphs, which shall be called "instance graphs". The representation is similar to the definition graph representation, with some important changes.

An instance graph $G_i$ can be defined as an ordered pair ($N_i$, $E_i$) where
I. $N_i = \{N_{i1}, N_{i2}, \ldots, N_{ik}\}$ is the set of nodes in the instance graph such that:
Each node $N_{ij}$ is associated with a unique identifier $n_{ij}$.
Each node of the instance graph is associated with a node of its definition graph, which forms the type of this node (this node of the definition graph will be called the type-node of the node in the instance graph).

As a mandatory attribute, every node has a name.

Each node is associated with a vector of attributes. These attributes have their corresponding types in the attribute vector of the type-node, which this node is associated with.

The nodes in the instance graphs do not have any weights associated with them. Also, there is no ordering constraint on the identifiers of the nodes as was imposed on the nodes of the definition graph.

I. $E_i = \{E_{i1}, E_{i2}, \ldots, E_{ik}\}$ is the set of edges in the instance graph such that:

Each edge $E_{ij}$ in the instance graph is associated with a unique identifier $e_{ij}$.

Each edge of the instance graph is associated with an edge in its definition graph, which forms the type of this edge (this edge of the definition graph is called the type-edge of the edge in the instance graph).

As a mandatory attribute, every edge has a name.

Each edge is associated with an ordered pair of nodes ($N_1$, $N_2$) such that the directionality of the edge is from $N_1$ to $N_2$. Note that this is different from the way the definition graphs are represented.

Each edge is associated with a vector of attributes. These attributes have their corresponding types in the attribute vector of the type-edge, which this edge is associated with.

So, the NodeTable and the EdgeTable for the instance graph are as follows:

| Node Table for Instance Graph | | | |
|---|---|---|---|
| Node_id | Name | Type | Attribute Vector |

| Edge Table for Instance Graph | | | | | |
|---|---|---|---|---|---|
| Edge_id | Name | Node1 | Node2 | Type | Attribute Vector |

4. Construction and User Interface

This component takes the metamodel, i.e. the definition graph, from the definition component and is responsible to see that the user can create models for the definition configured. It learns about the types of nodes and the edges that the user can be allowed to create. Specifically, the user should not be able to:

Create nodes of types not present in the metamodel

Create edges of types not present in the metamodel

It is not difficult for the construction component 60 to take care of this. One approach would be to dynamically load the toolbar with the types of nodes and edges that the user can create according to the current definition. This way, the user has no means of creating an invalid node or an edge.

As already mentioned, every node will be associated with a node renderer, every edge will be associated with an edge renderer, and every attribute will be associated with an attribute editor and an attribute validator. When the user creates a node or an edge, the UI component asks the registered renderer to draw the node or the edge on the work panel. It then allows the user to enter the attributes for the node or the edge by using the attribute editor registered with the particular attribute. Before saving the attributes into the instance graph, it calls upon the attribute validator to check whether the user-entered attribute is proper. Attribute Editors are separated from Attribute Validators in order to allow maximum reusability. For example, an Attribute Editor for strings can be used by several attributes, but the method of validating them could be different, in which case, they will have different Attribute Validators. Thus, the UI component 60 maintains a NodeRenderer Table, EdgeRenderer Table, AttributeEditor Table, and AttributeValidator Table. These can be maintained as hash tables keyed by unique names. The nodes and the edges in the definition graph will refer these keys.

5. Model Validity and Compatibility Check

The validation component 58 is responsible for performing this check. It gets the definition graph currently configured and the instance graph created by the user, which needs to be validated.

The strategy employed here, to check the integrity of the model, is to derive a new definition out of the instance graph provided by the user. This new derived graph is called the "definition template graph". Once the definition template graph is obtained, whether the derived template graph and the configured definition graph are compatible can be checked. Normally, in other systems, when a check has to be made to determine whether a given instance (not necessarily graphs) corresponds to the definition, the strategy employed is to go though the instance thoroughly to find out if it violates any rules in the definition.

There are three steps in the validation of the model or the instance graph:

I. Create a skeletal definition graph template from the definition graph.

II. Parse the instance graph. For every node and the edge in the instance graph, update the template graph.

III. Match the generated template graph and the definition graph for compatibility. Report errors if there are discrepancies between the template graph and the definition graph, otherwise, the model is ready for persistence.

The Skeletal Definition Graph Template:

Due to the fact that the construction component takes care not to allow the user to create any nodes, edges or attributes that do not belong to the current definition, model validation can only be bothered about the multiplicity values of the nodes and the edges, and the directionality values of the edges. In other words, the validation component 58 checks to see whether the rules of multiplicity and directionality specified in the definition graph are adhered to by the instance graph. Hence, the skeletal definition graph template that will be created will have two tables, the node table and the edge table. These tables will have the information as shown below.

The edge table for the template graph will also have two hash tables associated with every edge. The first hash table is for holding information about the occurrence of the nodes of the 'from' type and the second hash table holds information about the occurrence of the nodes of the 'to' type. As each edge is parsed in the instance graph, the occurrence information of the relevant nodes associated with that edge is entered into these hash tables. We note that since this is a hash table, only one entry per node in the instance graph will be made here. This information will be used in deciding whether the promotion of multiplicity for that node in the edge has to be done or not.

| Node Table for Definition Graph Template | |
|---|---|
| Node_id | Weight |
| | |

| Edge Table for Definition Graph Template | | | |
|---|---|---|---|
| Edge_id | Weight | 'From Nodes' hash table | 'To Nodes' hash table |

The encoding of the multiplicity and directionality values into the weights of the nodes and the edges are done in the same manner as for the definition graphs before the validation of the metamodel. The encoding is given in the following table.

| Multiplicity | Bit Pattern |
|---|---|
| 0 | 001 |
| 1 | 010 |
| + | 100 |
| * | 111 |

| Directionality | Bit Pattern |
|---|---|
| $N_1 \rightarrow N_2$ | 01 |
| $N_1 \leftarrow N_2$ | 10 |
| $N_1 \leftrightarrow N_2$ | 11 |

Parsing the Instance Graph and Updating the Definition Template Graph:

The following algorithm is proposed, which performs the validation of the model. The method involves parsing all the nodes and the edges in the instance graph, and for every node or edge, the weight of the corresponding type-node or the type-edge of the definition graph template is updated suitably to reflect the correct multiplicity and directionality values. Once the parsing of all the nodes and the edges is completed, the definition graph template is ready for compatibility check with the original definition graph, which will be performed in the next step.

```
#define FROM_NODE 224 //the bit pattern for [11100000]
#define TO_NODE 28 //the bit pattern for [00011100]
initialize the definition graph template with default values.
  The default values for multiplicity is 0 (001) and for
directionality is nil (00)
For all nodes (Ni) in the instance graph
  Get Ndi from Ni // (which is the type-node identifier of
  Ni)
  Get weight of Ndi from the template graph
  Weight = promoteMultiplicity (NODE, weight)
End loop
For all edges (Ei) in the instance graph
  Get Edi from Ei // (which is the type-edge identifier of
  Ei)
  Get weight of Edi from the template graph
  If (node1 is not present in 'from' hash table in
  template graph for this edge)
```

-continued

```
    //node1 and node2 are the two nodes associated with this
    edge
    such that the edge is from Node1 to Node2.
    Weight = promoteMultiplicity (FROM_NODE, weight)
    Insert node1 into the 'from' hash table.
  End if
  If (node2 is not present in 'to' hash table in template graph
  for this edge)
    //node1 and node2 are the two nodes associated with this
    edge
    such that the edge is from Node1 to Node2.
    Weight = promoteMultiplicity (TO_NODE, weight)
    Insert node2 into the 'to' hash table.
  End if
  Weight = promoteDirectionality (node1 < node2, weight)
End Loop
```

There are two function used in the above algorithm. They are, promoteMultiplicity( ) and promoteDirectionality( ). Both these functions are bit manipulation functions which alter the weights given to them such that the occurrence of one more node or an edge is accounted for in the weight, and so is the occurrence of an edge in a particular direction. The behavior of these functions can be understood by the following pseudocode.

```
Function promoteMultiplicity (byte mask, byte weight) returns
weight
  StoreWeight = weight & (~mask); //all operations are
  bitwise logical operations
  WorkingWeight = weight & mask;
  If ((workingWeight & 144) !=0) WorkingWeight <<= 1;
  WorkingWeight |= StoreWeight;
  Return workingWeight;
End function
```

Note that the right shift operation fills up a 0 for the least significant bit of the weight.

```
Function promoteDirectionality (Boolean correctOrder, byte
weight) returns weight
  StoreWeight = weight & 252; //bit pattern for [11111100]
  Weight &=3;
  If (correctOrder) weight |= 1;
  Else weight |= 2;
  Weight |= StoreWeight;
  Return weight;
End function
```

Matching the Generated Template Graph and the Definition Graph for Compatibility:

The algorithm for this compatibility check is given below.

```
For all nodes (Ni) in the definition graph
  Get the weight Wdi of the current node Ni from the
  definition graph
  Get the corresponding weight Wti from the template graph
  If ((Wdi & Wti) == 0) report Node Multiplicity error and
  quit.
End loop
For all edges (Ei) in the definition graph
  Get the weight Wdi of the current edge Ei from the
  definition graph
  Get the corresponding weight Wti from the template graph
```

-continued

```
TestByte = Wdi & Wti
If ((Wti&3) !=0) If ((Wti&3) != (Wdi&3)) report error in
directionality and quit
If ((TestByte & 224) == 0) report error in Node1
multiplicity in edge Ei and quit
If ((TestByte & 28) == 0) report error in Node2
multiplicity in edge Ei and quit
End loop
```

Note that the time complexity of the validation process is $O(n_d+e_d+n_i+e_i)$, where $n_d$ and $e_d$ are the numbers of nodes and edges in the definition graph respectively, and $n_i$ and $e_i$ are the numbers of nodes and edges in the instance graph. When this algorithm exits successfully, the instance graph is validated against the definition graph. The system can then proceed to persist the model if the user wishes to.

C. Encoding of Weights and Algorithms

The following discussion expands upon steps and processes discussed above.

The metamodel is represented as definition graph and the models created by the user are represented as instance graphs. To check for the compatibility of these instance graphs with the configured definition graph, a new graph is extracted from the instance graph called template graph. Then, the template graph and the definition graph are checked for compatibility. In particular, compatibility check includes matching the weights of the template graph and the definition graph. The weight contains the information about the multiplicity and directionality values of the nodes and the edges. By parsing the instance graph, the template graph is constructed. As each node and edge is parsed in the instance graph, the weight of the template graph is updated. The template graph thus constructed may not be identical to the definition graph. Thus, the two graphs are not necessarily isomorphic. However, it is necessary to check for compatibility between the two graphs. For example, the definition graph may say that the multiplicity value of a node is +, which means that the node may have 1 or more appearance in the instance graph. Thus the multiplicity of 1 or + in the template graph is compatible with the multiplicity value of + in the definition graph. Because of the above argument, there are two sets of encoding. Encoding of weights is done differently for the definition graph than that for the template graph to facilitate the compatibility check.

Encoding of Multiplicity Values:

The following table gives the information about the compatible multiplicity values for the definition graph and the template graph. Depending on this table, the encoding of the weights can be determined, so that it is easy to perform the compatibility check.

| Multiplicity value in Definition Graph. | Corresponding allowed multiplicity values in the template graph. |
|---|---|
| ? | 0, 1 |
| 1 | 1 |
| + | 1, 2, 3, . . . |
| * | 0, 1, 2, 3, . . . |

Begin by considering the encoding of the multiplicity values in the template graph. As the instance graph is parsed, the template graph is constructed. Initially, since no nodes or edges have been encountered yet, the multiplicity values of the nodes and the edges in the template graph should be 0. As the first node or edge of that type is encountered, the multiplicity value to 1 is changed. Then, when the second node or edge is encountered, the multiplicity value is updated to reflect this, to a different value. From now on, no matter how many nodes or edges of that type are encountered, the multiplicity value is not altered. This encoding is done as follows:

Encoding for multiplicity values in the template graph

| | |
|---|---|
| 0 (initial value) | 001 |
| 1 (first node encountered) | 010 |
| + (Second node is encountered) (this does not change even if more nodes are encountered) | 100 |

Now, consider how to encode the multiplicity values for the definition graph. Since it should accept both 0 and 1, it will be encoded as 001 010, i.e., 011. Logically ANDing 001| or 010 with 011, gets a non-zero value. This property is utilized in the validation algorithms. The encoding of the other multiplicity values is shown below.

Encoding for multiplicity values in the definition graph

| | |
|---|---|
| ? | 011 |
| 1 | 010 |
| + | 110 |
| * | 111 |

By observing the second and third tables, it is possible to verify easily that the behavior shown by the first table is satisfied.

Encoding of Directionality Values:

The logic behind this encoding is straightforward. There are three possible directionality values for an edge between two nodes N1 and N2 as shown below.

| | |
|---|---|
| N1→N2 | 01 |
| N1←N2 | 10 |
| N1↔N2 | 11 |

The encoding for the directionality value is the same for both the template graph and the definition graph. The initial value of the directionality will be 00, which also signifies that no edge of that type has occurred. The logic here is that two directionality values are compatible if the result of logically ANDing them will lead to a non-zero result. Observe from the above table that both N1→N2, and N1←N2 are compatible with N1↔N2, while they themselves are not compatible with each other, which is the required behavior.

Promotion of Multiplicity Values:

Promotion of multiplicity value is done for the template graph during the parsing of the instance graph. The following promotions need to be done.

| | |
|---|---|
| Initial value of multiplicity: | 001 |
| First node occurred: | 001 → 010 |
| Second node occurred: | 010 → 100 |
| Any number of further nodes: | 100 → 100 |

The simple behavior above is to left shift the bits so that the 1 gets shifted to a higher significant bit, until it becomes 100. Do not further shift once it has reached 100. The function promoteMultiplicity given above achieves the above behavior. It is necessary to be careful in calling this function promoteMultiplicity. A track of the nodes that have occurred for each edge is maintained in the form of hash tables for each edge in the template graph. Verify whether it is correct for us to promote a particular multiplicity by consulting this hash table.

Since the nodes have their multiplicity values in the first three bits (most significant), while parsing the nodes of the instance graph, the promoteMultiplicity function is called with the 11100000 (224) mask. For edges, depending on the occurrence of the node in the edge, the corresponding mask 11100000 (224) or 00011100 (28) is sent, so that the correct multiplicity value gets promoted.

Promotion of Directionality Values:

This promotion, which is done to the edges of the template graph when the instance graph is being parsed, is very simple. Logically ORing the new directionality into the existing directionality value obtains the effective directionality. For example, if the current directionality of a particular edge is 01 (which means that an edge N1→N2 has already been encountered), and a new edge N1←N2 is encountered, then the existing directionality value (01) is logically ORed with 10 (the code for edges of type N1←N2). Then the effective directionality would be 11, meaning that this particular edge is bi-directional. It is easy to see that this technique works for all cases.

Checking for Compatibility Between Definition and Template Graphs:

Due to the encoding scheme and the promotion of multiplicity and directionality values, this task is very simple. The logic here is to logically AND the two values which are being checked for compatibility. If the result is non-zero, then everything is satisfactory. Otherwise, it is necessary to report the corresponding error and quit. An error in the directionality can occur only if an edge of that type has occurred in the instance graph, which will be indicated in the template graph directionality as non-00 code. So, in the algorithm, a check is first made to see if at all edges of that type have occurred, and only then, the directionality error check is made.

D. Worked Example

Modeling Environment:

The user wants to model simple business processes. Each business process can have one or more activities. The activities can have zero or more input and output data. Also, the process itself can have zero or more input and output data. Note that the actual control flow for this process is not captured in these models (usually, they are done in separate diagrams called workflow diagrams. Thus, there could be many workflows for a single process defined by the models under consideration).

Figure 6:
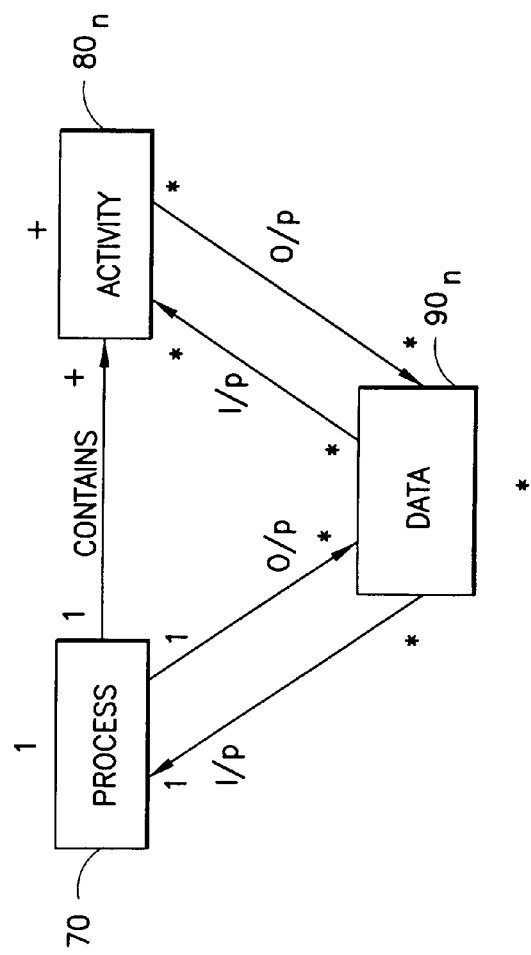
FIG. 6 is a metamodel of the worked example.

The system is configured with the metamodel shown in FIG. 6. This metamodel asserts that 1. A process 70 can have "contains" relationship with plural activities $80_n$ in the instance graphs.
2. This "contains" relationship between process 70 and activity $80_n$ is directed from process 70 to activity $80_n$.
3. There can be only one instance node of type process 70 in the instance graphs corresponding to this metamodel.
4. There can be one or more instance nodes of type activity $80_n$ in the instance graph.
5. The instance node of type process 70 in the instance graphs can be associated with zero or more instance nodes of type data $90_n$ through the relationship "o/p".
6. The instance node of type process 70 in the instance graphs can be associated with zero or more instance nodes of type data $90_n$ through the relationship "i/p".
7. Since there can be only one instance node of type process 70 in the instance graphs, each instance node of type data $90_n$ can be related to only one instance node of type process 70 (either through the relationships "o/p" or "i/p").
8. The instance node of type activity $80_n$ in the instance graphs can be associated with zero or more instance nodes of type data $90_n$ through the relationship "o/p".
9. The instance node of type activity $80_n$ in the instance graphs can be associated with zero or more instance nodes of type data $90_n$ through the relationship "i/p".
10. Each instance node of type data $90_n$ in the instance graph can be related to zero or more instance nodes of type activity $80_n$ through the "o/p" or the "i/p" relationships.

Metamodel Representation:

Initially, when the user configures the system with the above definition, the following definition graph is constructed in memory. The renderer of the node or the edge is not considered, nor the attributes contained by the node or the edge.

Node Table for Definition Graph (before metamodel validation)

| Node_id | Name | Weight |
|---|---|---|
| 001 | Process | 01000000 |
| 002 | Activity | 10000000 |
| 003 | Data | 11100000 |

Edge Table for Definition Graph (before metamodel validation)

| Edge_id | Name | Node1 | Node2 | Weight |
|---|---|---|---|---|
| E001 | p.contains.a | 001 | 002 | 01010001 |
| E002 | activity_i/p | 002 | 003 | 11111110 |
| E003 | activity_o/p | 002 | 003 | 11111101 |
| E004 | process_i/p | 001 | 003 | 01011110 |
| E005 | process_o/p | 001 | 003 | 01011101 |

Metamodel Validation:

The algorithm presented above, relating to metamodel validation, is traced here for the above example. The "for" loop runs for all the edges:

E001: The nodes that this edge connects are of type 001 and 002. They are present in the node table.

nm1=010; nm2=100; ejm1=010; ejm2=100;

estimate(nm1, ejm2) returns 110;

match(nm2, estimate(nm1, ejm2))=match(100, 110) returns true;

estimate(nm2, ejm1) returns 110;
match(nm1, estimate(nm2, ejm1))=match(010, 110) returns true;

Everything is correct with this edge.
E002: The nodes that this edge connects are of type 002 and 003. They are present in the node table.
nm1=100; nm2=111; ejm1=111; ejm2=111;
estimate(nm1, ejm2) returns 111;
match(nm2, estimate(nm1, ejm2))=match(111, 111) returns true;
estimate(nm2, ejm1) returns 111;
match(nm1, estimate(nm2, ejm1))=match(100, 111) returns true;

Everything is correct with this edge.
E003: The nodes that this edge connects are of type 002 and 003. They are present in the node table.
nm1=100; nm2=111; ejm1=111; ejm2=111; estimate(nm1, ejm2) returns 111;
match(nm2, estimate(nm1, ejm2))=match(111, 111) returns true;
estimate(nm2, ejm1) returns 111;
match(nm1, estimate(nm2, ejm1))=match(100, 111) returns true;

Everything is correct with this edge.
E004: The nodes that this edge connects are of type 001 and 003. They are present in the node table.
nm1=010; nm2=111; ejm1=010; ejm2=111;
estimate(nm1, ejm2) returns 111;
match(nm2, estimate(nm1, ejm2))=match(111, 111) returns true;
estimate(nm2, ejm1) returns 111;
match(nm1, estimate(nm2, ejm1))=match(010, 111) returns true;

Everything is correct with this edge.
E005: The nodes that this edge connects are of type 001 and 003. They are present in the node table.
nm1=010; nm2=111; ejm1=010; ejm2=111;
estimate(nm1, ejm2) returns 111;
match(nm2, estimate(nm1, ejm2))=match(111, 111) returns true;
estimate(nm2, ejm1) returns 111;
match(nm1, estimate(nm2, ejm1))=match(010, 111) returns true;

Everything is correct with this edge.
Thus the metamodel validation algorithm exits successfully, meaning that the metamodel supplied by the user is valid and it can be used to create instance models.

As an example for erroneous metamodel, assume that the multiplicity value of the Activity (002) node in the definition graph is * (instead of +). Now, repeating the algorithm for this case to see how the algorithm detects the error.
E001: The nodes that this edge connects are of type 001 and 002. They are present in the node table.
nm1=010; nm2=111; ejm1=010; ejm2=100;
estimate(nm1, ejm2) returns 110;
match(nm2, estimate(nm1, ejm2))=match(111, 110) returns false;

Hence, the definition of this edge is not proper. The user will be informed of this by the system, so that the necessary changes can be made before the system proceeds to allow the user to create models for this metamodel.

ChangeEncoding:
After the metamodel is validated, the weights of the nodes and the edges are suitably adjusted to facilitate easy validation of the model. The function changeEncoding is run on the definition graph to obtain the following definition graph.

| Node Table for Definition Graph (after metamodel validation): | | |
|---|---|---|
| Node_id | Name | Weight |
| 001 | Process | 01000000 |
| 002 | Activity | 11000000 |
| 003 | Data | 11100000 |

| Edge Table for Definition Graph (after metamodel validation): | | | | |
|---|---|---|---|---|
| Edge_id | Name | Node1 | Node2 | Weight |
| E001 | p.contains.a | 001 | 002 | 01011001 |
| E002 | activity_i/p | 002 | 003 | 11111110 |
| E003 | activity_o/p | 002 | 003 | 11111101 |
| E004 | process_i/p | 001 | 003 | 01011110 |
| E005 | process_o/p | 001 | 003 | 01011101 |

Model Representation:
Assume that the user creates the model shown in FIG. 7 by using the GUI and the construction component. In this example, there is a single process 70, termed "Procurement". The process contains three activities, respectively "approved purchase request $80_1$, create purchase request $80_2$, and modify purchase request $80_3$. The approved purchase request activity $80_1$ has a single output relationship with data "purchase order" $90_1$ and an input relationship from data "Purchase Request" $90_2$. The create purchase activity $80_2$ has a single input relationship with data "current stock" $90_3$ and a single output relationship with the purchase request data $90_2$. Lastly, the modified purchase request activity $80_3$ has input relationships with the purchase request data $90_2$ and the current stock data $90_3$. It has a single output relationship with "New Purchase Request" data $90_4$.

In this particular example, all edges are unidirectional. If any of the edges are allowed to be bi-directional, as stated in the metamodel, then one edge for each direction occurs in the instance models.

| Node Table for the instance graph: | | |
|---|---|---|
| Node_id | Name | Type |
| NI001 | Procurement Process | 001 |
| NI002 | Create Purchase Request | 002 |
| NI003 | Modify Purchase Request | 002 |
| NI004 | Approve Purchase Request | 002 |
| NI005 | Current Stock | 003 |

Node Table for the instance graph:

| Node_id | Name | Type |
|---|---|---|
| NI006 | Purchase Request | 003 |
| NI007 | New Purchase Request | 003 |
| NI008 | Purchase Order | 003 |

Edge Table for the instance graph:

| Edge_id | Name | Node1 | Node2 | Type |
|---|---|---|---|---|
| EI001 | Contains | NI001 | NI002 | E001 |
| EI002 | Contains | NI001 | NI003 | E001 |
| EI003 | Contains | NI001 | NI004 | E001 |
| EI004 | I/p | NI005 | NI002 | E002 |
| EI005 | I/p | NI005 | NI003 | E002 |
| EI006 | I/p | NI006 | NI003 | E002 |
| EI007 | I/p | NI006 | NI004 | E002 |
| EI008 | O/p | NI002 | NI006 | E003 |
| EI009 | O/p | NI004 | NI008 | E003 |
| EI010 | O/p | NI003 | NI007 | E003 |

Model Validation:

The first step here is to construct a skeletal template graph, based on the definition graph which is done as follows.

Initial Node Table for Template Graph:

| Node_id | Weight |
|---|---|
| 001 | 00100000 |
| 002 | 00100000 |
| 003 | 00100000 |

Initial Edge Table for Template Graph:

| Edge_id | Weight | 'From' hash table | 'To' hash table |
|---|---|---|---|
| E001 | 00100100 | Empty | Empty |
| E002 | 00100100 | Empty | Empty |
| E003 | 00100100 | Empty | Empty |
| E004 | 00100100 | Empty | Empty |
| E005 | 00100100 | Empty | Empty |

The next step is to parse the instance graph and update the weights of the template graph. The algorithm given above, relating to parsing, is executed. The multiplicity and directionality values are appropriately promoted as explained in Section C, to obtain a template graph as shown below.

Final Node Table for Template Graph:

| Node_id | Weight |
|---|---|
| 001 | 01000000 |
| 002 | 10000000 |
| 003 | 10000000 |

Final Edge Table for Template Graph:

| Edge_id | Weight | 'From' hash table | 'To' hash table |
|---|---|---|---|
| E001 | 01010001 | NI001 | NI002, NI003, NI004 |
| E002 | 10010010 | NI005, NI006 | NI002, NI003, NI004 |
| E003 | 10010001 | NI002, NI003, NI004 | NI006, NI007, NI008 |
| E004 | 00100100 | Empty | Empty |
| E005 | 00100100 | Empty | Empty |

Matching the Definition Graph and the Template Graph:

Once the template graph has been constructed, it is ready for compatibility check with the originally configured definition graph. The algorithm presented above, relating to matching, does this. The main idea here is to logically AND the relevant parts of the weights of the template and the definition graphs and verify that the result obtained is not zero. If so, the two graphs are compatible, and hence one can conclude that the instance graph conforms to the configured definition.

The corresponding weights of the node and edge tables which need to be checked for compatibility is given below. Also, the parts of the weights that will be compared have been demarcated, although the whole weight is just one byte.

Compatibility check for nodes:

| Node_id | Weight in the definition graph | Weight in the template graph |
|---|---|---|
| 001 | 010 000 00 | 010 000 00 |
| 002 | 110 000 00 | 100 000 00 |
| 003 | 111 000 00 | 100 000 00 |

Compatibility check for edges:

| Edge_id | Weight in the definition graph | Weight in the template graph |
|---|---|---|
| E001 | 010 110 01 | 010 100 01 |
| E002 | 111 111 10* | 100 100 10 |
| E003 | 111 111 01 | 100 100 01 |
| E004 | 010 111 10 | 001 001 00 |
| E005 | 010 111 01 | 001 001 00 |

It can be noted from the above tables that the weights match and hence it can be concluded that the instance graph generated by the user conforms to the definition configured. Note also that if the directionality value of an edge in the template graph is 00, it implies that an edge of that type has not occurred at all in the instance graph. While matching the definition and the template graph with the algorithm just discussed, the algorithm goes ahead to ensure the directionality value compatibility only if an edge of that type has indeed occurred.

E. Computer Implementation

Figure 8:
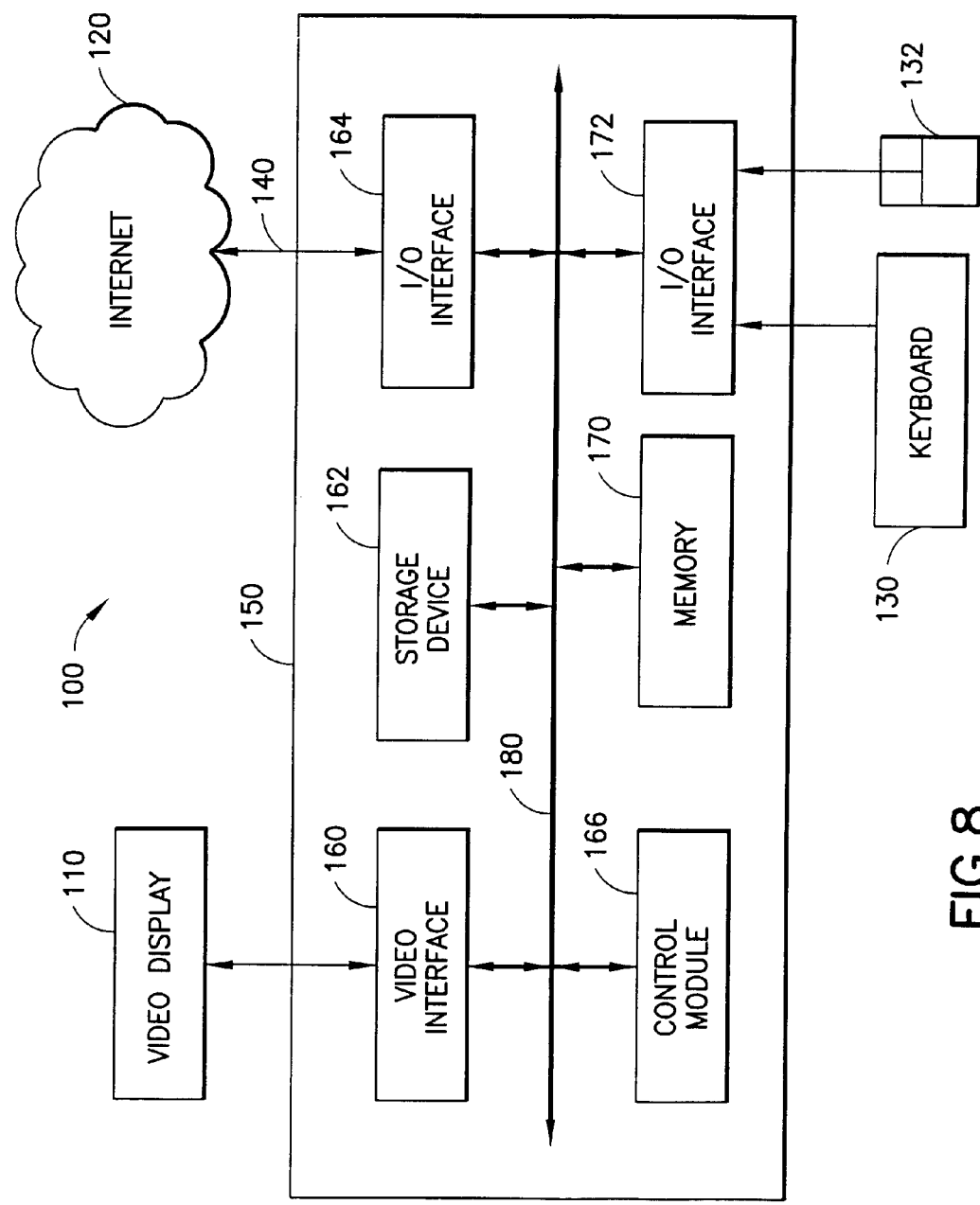
FIG. 8 is a schematic block diagram of a hardware/computing apparatus upon which the invention may be practised.

The process for modeling can be implemented using a computer program product in conjunction with a computer system 100 as shown in FIG. 8. In particular, the modeling can be implemented as software, or computer readable program code, executing on the computer system 100.

The computer system 100 includes a computer 150, a video display 110, and input devices 130, 132. In addition, the computer system 100 can have any of a number of other output devices including line printers, laser printers, plotters, and other reproduction devices connected to the computer 150. The computer system 100 can be connected to one or more other computers via a communication input/output (I/O) interface 164 using an appropriate communication channel 140 such as a modem communications path, an electronic network, or the like. The network may include a local area network (LAN), a wide area network (WAN), an Intranet, and/or the Internet 120.

The computer 150 includes the control module 166, a memory 170 that may include random access memory (RAM) and read-only memory (ROM), input/output (I/O) interfaces 164, 172, a video interface 160, and one or more storage devices generally represented by the storage device 162. The control module 166 is implemented using a central processing unit (CPU) that executes or runs a computer readable program code that performs a particular function or related set of functions.

The video interface 160 is connected to the video display 110 and provides video signals from the computer 150 for display on the video display 110. User input to operate the computer 150 can be provided by one or more of the input devices 130, 132 via the I/O interface 172. For example, a user of the computer 150 can use a keyboard as I/O interface 130 and/or a pointing device such as a mouse as I/O interface 132. The keyboard and the mouse provide input to the computer 150. The storage device 162 can consist of one or more of the following: a floppy disk, a hard disk drive, a magneto-optical disk drive, CD-ROM, magnetic tape or any other of a number of non-volatile storage devices well known to those skilled in the art. Each of the elements in the computer system 150 is typically connected to other devices via a bus 180 that in turn can consist of data, address, and control buses.

The method steps for modeling are effected by instructions in the software that are carried out by the computer system 100. Again, the software may be implemented as one or more modules for implementing the method steps.

In particular, the software may be stored in a computer readable medium, including the storage device 162 or that is downloaded from a remote location via the interface 164 and communications channel 140 from the Internet 120 or another network location or site. The computer system 100 includes the computer readable medium having such software or program code recorded such that instructions of the software or the program code can be carried out. The use of the computer system 100 preferably effects advantageous apparatuses for constructing a runtime symbol table for a computer program in accordance with the embodiments of the invention.

The computer system 100 is provided for illustrative purposes and other configurations can be employed without departing from the scope and spirit of the invention. The foregoing is merely an example of the types of computers or computer systems with which the embodiments of the invention may be practised. Typically, the processes of the embodiments are resident as software or a computer readable program code recorded on a hard disk drive as the computer readable medium, and read and controlled using the control module 166. Intermediate storage of the program code and any data including entities, tickets, and the like may be accomplished using the memory 170, possibly in concert with the storage device 162.

In some instances, the program may be supplied to the user encoded on a CD-ROM or a floppy disk (both generally depicted by the storage device 162), or alternatively could be read by the user from the network via a modem device connected to the computer 150. Still further, the computer system 100 can load the software from other computer readable media. This may include magnetic tape, a ROM or integrated circuit, a magneto-optical disk, a radio or infrared transmission channel between the computer and another device, a computer readable card such as a PCMCIA card, and the Internet 120 and Intranets including email transmissions and information recorded on Internet sites and the like. The foregoing are merely examples of relevant computer readable media. Other computer readable media may be practised without departing from the scope and spirit of the invention.

The modeling can be realised in a centralised fashion in one computer system 100, or in a distributed fashion where different elements are spread across several interconnected computer systems.

Computer program means or computer program in the present context mean any expression, in any language, code or notation, of a set of instructions intended to cause a system having an information processing capability to perform a particular function either directly or after either or both of the following: a) conversion to another language, code or notation or b) reproduction in a different material form.

In the foregoing description generalised modeling tools, apparatus and systems have been described in accordance with preferred embodiments of the invention. It will be apparent to one skilled in the art, however, that numerous changes and/or modifications can be made without departing from the spirit and scope of the invention.

I claim:

1. A method for modeling a system, said method comprising executing computer readable program code by a processor of a computer system, said executing comprising performing the steps of:
    configuring a metamodel with a specified environment in a directed weighted multi-graph representation of a definition graph having nodes and connecting edges;
    validating said metamodel;
    representing a user-generated model as an instance of the metamodel in a form of an instance graph having nodes and connecting edges, wherein the nodes and edges of the instance graph are unweighted, wherein each node of the definition graph has a weight of binary bits having an encoded multiplicity value that indicates a number of nodes of a type of said each node that can be present in the instance graph, and wherein each edge of the definition graph has a weight of binary bits having the encoded multiplicity value for each node associated with said each edge and having encoded information about a directionality of said each edge;
    checking compatibility of said user model with said validated metamodel with respect to a compatibility between the weights of the nodes in the definition graph and the number of nodes of each type in the instance graph and also with respect to a compatibility between the weights of the edges in the definition graph and aspects of the edges of the instance graph, said aspects of each edge of the instance graph comprising the directionality of said each edge and the type of the nodes connected by said each edge;

persisting said user model if said checking compatibility determines that said user model is compatible with said metamodel, said persisting said user model comprising storing said user model in a storage device; and reporting an incompatibility error if said checking compatibility determines that said user model is not compatible with said metamodel.

2. The method of claim 1, wherein, in said metamodel validation step, said definition graph is validated by determining whether the multiplicity value of a node and the multiplicity value of the other node in the edge correctly determine the multiplicity value of the other node.

3. The method of claim 1, wherein said model compatibility checking step includes the steps of:

creating a template graph from said definition graph, said template graph initially comprising default values for the weights and edges of the definition graph, said default values for the weights and edges of the definition graph being expressed in binary bits;

pursing said instance graph to ascertain the multiplicity of the node type of every node in the instance graph and to ascertain the directionality of every edge in the instance graph;

for every node and edge in said instance graph, updating the weights and edges of said template graph to reflect the multiplicity and directionality of the nodes and edges, respectively, ascertained from the parsing step, said updated values for the weights and edges of the definition graph being expressed in binary bits;

after said updating, verifying said template graph for compatibility with said definition graph, said verifying comprising:

bitwise logically ANDing the weights of the nodes of the template graph and the weights of the corresponding nodes of the definition graph;

bitwise logically ANDing the weights of the edges of the template graph and the weights of the corresponding edges of the definition graph, and determining that said user model is compatible with said metamodel if every said bitwise logically ANDing returns a non-zero value, otherwise determining that said user model is not compatible with said metamodel.

4. A computer-aided modeling system comprising:

input means by which a metamodel having a specified environment in a directed weighted multi-graph representation of a definition graph having nodes and connecting edges can be input, and by which a user-generated model also can be input, said user-generated model being represented as an instance of the metamodel in a form of an instance graph having nodes and connecting edges, wherein the nodes and edges of the instance graph are unweighted, wherein each node of the definition graph has a weight of binary bits having an encoded multiplicity value that indicates a number of nodes of a type of said each node that can be present in the instance graph, and wherein each edge of the definition graph has a weight of binary bits having the encoded multiplicity value for each node associated with said each edge and having encoded information about a directionality of said each edge;

displaying means for displaying said metamodel and by which said user model can be displayed;

processor means, coupled to said input means and said display means, for validating said input metamodel and for checking compatibility of said user model with said validated model with respect to a compatibility between the weights of the nodes in the definition graph and the number of nodes of each type in the instance graph and also with respect to a compatibility between the weights of the edges in the definition graph and aspects of the edges of the instance graph, said aspects of each edge of the instance graph comprising the directionality of said each edge and the type of the nodes connected by said each edge;

persisting means for persisting said user model if said checking compatibility determines that said user model is compatible with said metamodel, said persisting means comprising storing means for storing said user model in a storage device; and reporting means for reporting an incompatibility error if said checking compatibility determines that said user model is not compatible with said metamodel.

5. The system of claim 4, wherein said processor means validates said definition graph by determining whether the multiplicity value of a node and the multiplicity value of die other node in the edge correctly determine the multiplicity value of the other node.

6. The system of claim 4, wherein said processor means checks compatibility of said user model with said validated model by:

creating a template graph from said definition graph, said template graph initially comprising default values for the weights and edges of the definition graph, said default values for the weights and edges of the definition graph being expressed in binary bits;

parsing said instance graph to ascertain the multiplicity of the node type of every node in the instance graph and to ascertain the directionality of every edge in the instance graph;

for every node and edge in said instance graph, updating the weights and edges of said template graph to reflect the multiplicity and directionality of the nodes and edges, respectively, ascertained from the parsing step, said updated values for the weights and edges of the definition graph being expressed in binary bits;

after said updating, verifying said template graph for compatibility with said definition graph, said verifying comprising:

bitwise logically ANDing the weights of the nodes of the template graph and the weights of the corresponding nodes of the definition graph;

bitwise logically ANDing the weights of the edges of the template graph and the weights of the corresponding edges of the definition graph, and determining that said user model is compatible with said metamodel if every said bitwise logically ANDing returns a non-zero value, otherwise determining that said user model is not compatible with said metamodel.

7. A computer program product comprising computer program code means carried on a storage medium, said program code means including:

a first program code element for configuring a metamodel with a specified environment in a weighted multi-graph representation of a definition graph having nodes and connecting edges;

a second program code element for validating said metamodel;

a third program code element for representing a user-generated model as an instance of the metamodel in a form of an instance graph having nodes and connecting edges, wherein the nodes and edges of the instance graph are unweighted, wherein each node of the definition graph has a weight of binary bits having an encoded multiplicity value that indicates a number of nodes of a type of said each node that can be present in the instance graph, and wherein each edge of the definition graph has a weight of binary bits having the encoded multiplicity value for each node associated with said each edge and having encoded information about a directionality of said each edge;

a fourth program code element for checking compatibility of said user model with said validated metamodel with respect to a compatibility between the weights of the nodes in the definition graph and the number of nodes of each type in the instance graph and also with respect to a compatibility between the weights of the edges in the definition graph and aspects of the edges of the instance graph, said aspects of each edge of the instance graph comprising the directionality of said each edge and the type of the nodes connected by said each edge;

a program code element for persisting said user model if said checking compatibility determines that said user model is compatible with said metamodel, said persisting said user model comprising storing said user model in a storage device; and a program code element for reporting an incompatibility error if said checking compatibility determines that said user model is not compatible with said metamodel.

8. The computer program product of claim 7, wherein, for said second program code element, said definition graph is validated by determining whether the multiplicity value of a node and the multiplicity value of the other node in the edge correctly determine the multiplicity value of the other node.

9. The computer program product of claim 7, wherein said fourth program code element performs said checking compatibility of said user model with said validated metamodel by:

creating a template graph from said definition graph, said template graph initially comprising default values for the weights and edges of the definition graph, said default values for the weights and edges of the definition graph being expressed in binary bits;

parsing said instance graph to ascertain the multiplicity of the node type of every node in the instance graph and to ascertain the directionality of every edge in the instance graph;

for every node and edge in said instance graph, updating the weights and edges of said template graph to reflect the multiplicity and directionality of the nodes and edges, respectively, ascertained from the parsing step, said updated values for the weights and edges of the definition graph being expressed in binary bits;

after said updating, verifying said template graph for compatibility with said definition graph, said verifying comprising:

bitwise logically ANDing the weights of the nodes of the template graph and the weights of the corresponding nodes of the definition graph;

bitwise logically ANDing the weights of the edges of the template graph and the weights of the corresponding edges of the definition graph, and determining that said user model is compatible with said metamodel if every said bitwise logically ANDing returns a non-zero value, otherwise determining that said user model is not compatible with said metamodel.

10. The method of claim 1, wherein each node is associated with a Node-Renderer Component adapted to be used by a User Interface (UI) component to render nodes of said type of said each node in a model created by a user, wherein each node has a vector of attributes such that each attribute is associated with an Attribute Editor and Attribute Validator, adapted to be used by the UI component, and wherein each attribute represents an attribute that may be comprised by a node in the instance graph having the type of said each node.

11. The method of claim 10, wherein each edge is associated with an Edge-Renderer adapted to be used by the UI component to render said each edge, wherein each edge has a vector of attributes such that each attribute is associated with the Attribute Editor and Attribute Validator, adapted to be used by the UI component during construction of the model created by the user.

12. The system of claim 4, wherein each node is associated with a Node-Renderer Component adapted to be used by a User Interface (UI) component to render nodes of said type of said each node in a model created by a user, wherein each node has a vector of attributes such that each attribute is associated with an Attribute Editor and Attribute Validator, adapted to be used by the UI component, and wherein each attribute represents an attribute that may be comprised by a node in the instance graph having the type of said each node.

13. The system of claim 12, wherein each edge is associated with an Edge-Renderer adapted to be used by the UI component to render said each edge, wherein each edge has a vector of attributes such that each attribute is associated with the Attribute Editor and Attribute Validator, adapted to be used by the UI component during construction of the model created by the user.

14. The computer program product of claim 7, wherein each node is associated with a Node-Renderer Component adapted to be used by a User Interface (UI) component to render nodes of said type of said each node in a model created by a user, wherein each node has a vector of attributes such that each attribute is associated with an Attribute Editor and Attribute Validator, adapted to be used by the UI component, and wherein each attribute represents an attribute that may be comprised by a node in the instance graph having the type of said each node.

15. The computer program product of claim 14, wherein each edge is associated with an Edge-Renderer adapted to be used by the UI component to render said each edge, wherein each edge has a vector of attributes such that each attribute is associated with the Attribute Editor and Attribute Validator, adapted to be used by the UI component during construction of the model created by the user.

16. The method of claim 3, wherein after said verifying the template graph and the definition graph are not isomorphic with respect to each other, and wherein said verifying determines that said user model is compatible with said metamodel.

17. The system of claim 6, wherein after said verifying the template graph and the definition graph are not isomorphic with respect to each other, and wherein said verifying determines that said user model is compatible with said metamodel.

18. The computer program product of claim 9, wherein after said verifying the template graph and the definition graph are not isomorphic with respect to each other, and wherein said verifying determines that said user model is compatible with said metamodel.

19. The method of claim 3, wherein the method further comprises generating a node table and an edge table for the template graph, wherein the node table comprise a first column and a second column, wherein the first column of the node table identifies the nodes of the template graph, wherein the second column of the node table identifies the weights of the nodes identified in the first column of the node table, wherein the edge table comprises a first column, a second column, a third column, and a fourth column, wherein the first column of the edge table identifies the edges of the template graph, wherein the second column of the edge table identifies the weights of the edges identified in the first column of the edge table, wherein the third column of the edge table identifies occurrence of the nodes of the FROM type associated with the edges identified in the first column of the edge table, wherein the fourth column of the edge table identifies occurrence of the nodes of the TO type associated with the edges identified in the first column of the edge table, and wherein the FROM and TO types are defined such that each edge has a direction pointing from a node of the FROM type to a node of the TO type.

20. The system of claim 6, wherein the system further comprises means for generating a node table and an edge table for the template graph, wherein the node table comprise a first column and a second column, wherein the first column of the node table identifies the nodes of the template graph, wherein the second column of the node table identifies the weights of the nodes identified in the first column of the node table, wherein the edge table comprises a first column, a second column, a third column, and a fourth column, wherein the first column of the edge table identifies the edges of the template graph, wherein the second column of the edge table identifies the weights of the edges identified in the first column of the edge table, wherein the third column of the edge table identifies occurrence of the nodes of the FROM type associated with the edges identified in the first column of the edge table, wherein the fourth column of the edge table identifies occurrence of the nodes of the TO type associated with the edges identified in the first column of the edge table, and wherein the FROM and TO types are defined such that each edge has a direction pointing from a node of the FROM type to a node of the TO type.

21. The computer program product of claim 9, wherein the fourth program code performs generating a node table and an edge table for the template graph, wherein the node table comprise a first column and a second column, wherein the first column of the node table identifies the nodes of the template graph, wherein the second column of the node table identifies the weights of the nodes identified in the first column of the node table, wherein the edge table comprises a first column, a second column, a third column, and a fourth column, wherein the first column of the edge table identifies the edges of the template graph, wherein the second column of the edge table identifies the weights of the edges identified in the first column of the edge table, wherein the third column of the edge table identifies occurrence of the nodes of the FROM type associated with the edges identified in the first column of the edge table, wherein the fourth column of the edge table identifies occurrence of the nodes of the TO type associated with the edges identified in the first column of the edge table, and wherein the FROM and TO types are defined such that each edge has a direction pointing from a node of the FROM type to a node of the TO type.

* * * * *

UNITED STATES PATENT AND TRADEMARK OFFICE
CERTIFICATE OF CORRECTION

| | |
|---|---|
| PATENT NO. | : 7,082,386 B2 |
| APPLICATION NO. | : 09/790247 |
| DATED | : July 25, 2006 |
| INVENTOR(S) | : Srinivasa |

It is certified that error appears in the above-identified patent and that said Letters Patent is hereby corrected as shown below:

On the Title Page (75)
Delete "M" and insert --M.--.

Drawing Figure 2
Delete the dot below numeral 26

Column 1
Line 13, delete "presents" and insert -- present --

Column 3
Delete the space between lines 39 and 41

Column 6
Line 30, delete "$n_j$" and insert -- $n_{dj}$ --

Column 7
Line 29, delete ". . . , $E_{dl}$" and insert -- . . . , $E_{di}$ --

Column 9
Line 36, delete "Node1" and insert -- Node 1 --

Column 11
Line 52, delete "metamodel" and insert -- metamodel. --

Column 18
Leave a space after Line 61 and after Line 67

UNITED STATES PATENT AND TRADEMARK OFFICE
CERTIFICATE OF CORRECTION

PATENT NO. : 7,082,386 B2
APPLICATION NO. : 09/790247
DATED : July 25, 2006
INVENTOR(S) : Srinivasa It is certified that error appears in the above-identified patent and that said Letters Patent is hereby corrected as shown below:

Column 19
Leave a space after Line 4, Line 11, Line 15, Line 22, Line 26, Line 27, Line 33, Line 38, Line 44, Line 49

Signed and Sealed this

Twenty-sixth Day of December, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,082,386 B2 | Page 1 of 2 |
| APPLICATION NO. | : 09/790247 | |
| DATED | : July 25, 2006 | |
| INVENTOR(S) | : Srinivasa | |

Figure 7:
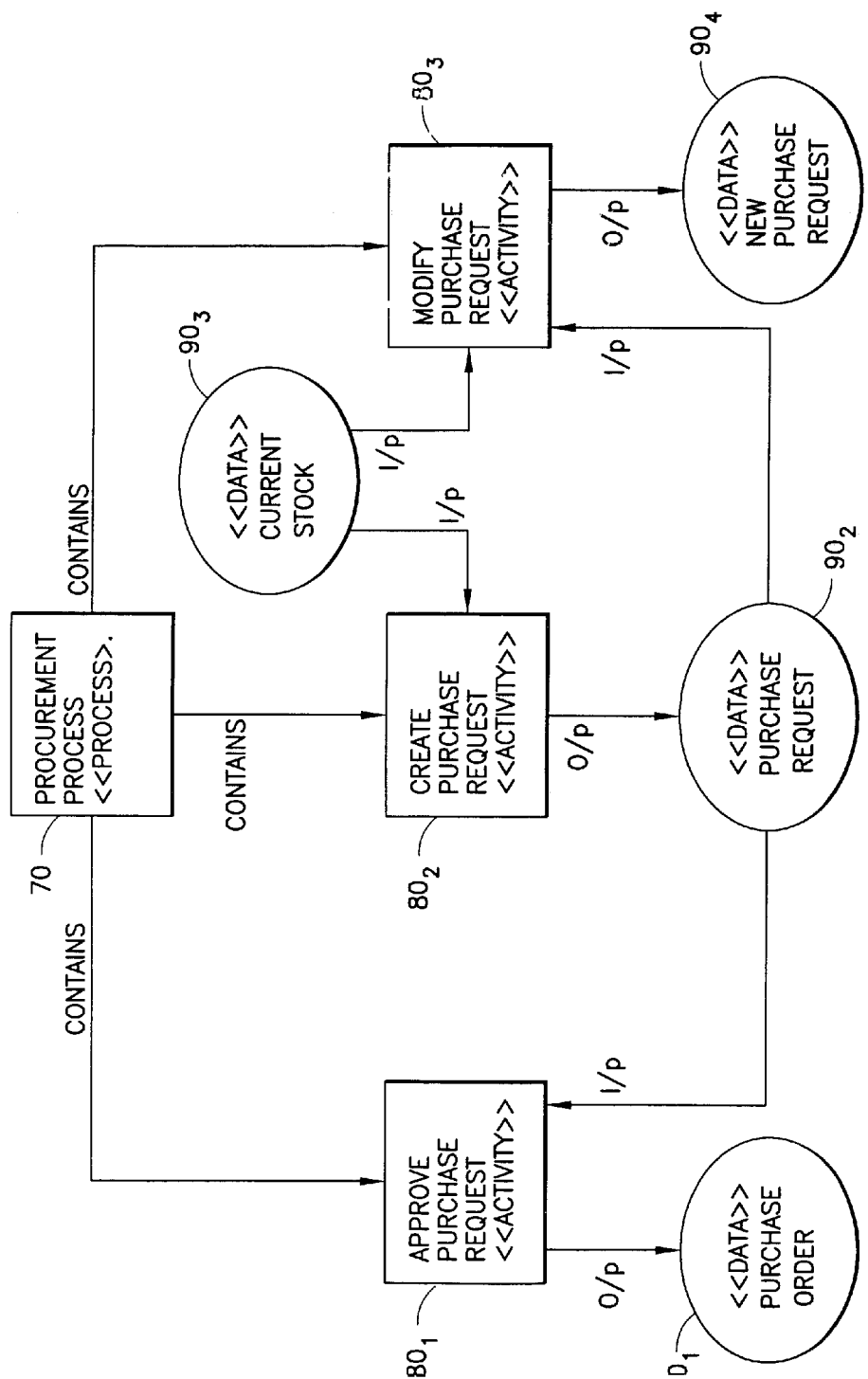
FIG. 7 is the user created model of the worked example.

It is certified that error appears in the above-identified patent and that said Letters Patent is hereby corrected as shown below:

Drawing Figure 7 issued in this patent is incorrect. The correct Drawing Figure 7 is shown below.

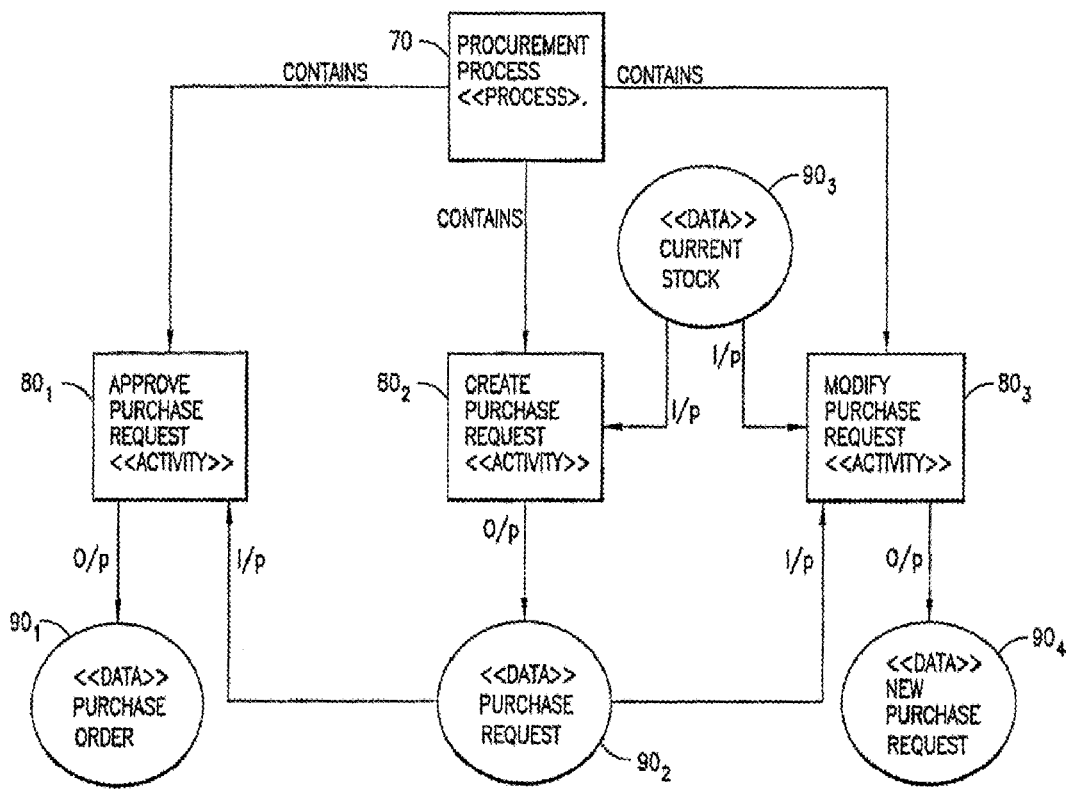

FIG.7

UNITED STATES PATENT AND TRADEMARK OFFICE
CERTIFICATE OF CORRECTION

PATENT NO. : 7,082,386 B2
APPLICATION NO. : 09/790247
DATED : July 25, 2006
INVENTOR(S) : Srinivasa It is certified that error appears in the above-identified patent and that said Letters Patent is hereby corrected as shown below:

Column 25
Line 27, delete "pursing" and insert -- parsing--

Column 26
Line 28, delete "die" and insert -- the --

Signed and Sealed this

Twenty-ninth Day of July, 2008

JON W. DUDAS
*Director of the United States Patent and Trademark Office*